(12) United States Patent
Okuno

(10) Patent No.: US 7,282,766 B2
(45) Date of Patent: Oct. 16, 2007

(54) FIN-TYPE SEMICONDUCTOR DEVICE WITH LOW CONTACT RESISTANCE

(75) Inventor: Masaki Okuno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 11/123,145

(22) Filed: May 6, 2005

(65) Prior Publication Data

US 2006/0157749 A1    Jul. 20, 2006

(30) Foreign Application Priority Data

Jan. 17, 2005  (JP)  ............................. 2005-008854
Jan. 17, 2005  (JP)  ............................. 2005-008855

(51) Int. Cl.
*H01L 27/04*    (2006.01)
(52) U.S. Cl. ................ 257/347; 257/350; 257/E29.151
(58) Field of Classification Search ......... 257/347–354
See application file for complete search history.

(56) References Cited

U.S. PATENT DOCUMENTS

| | | |
|---|---|---|
| 6,693,046 B2 | 2/2004 | Takigawa et al. |
| 6,707,156 B2 | 3/2004 | Suzuki et al. |
| 6,835,609 B1 * | 12/2004 | Lee et al. ................... 438/183 |
| 7,105,894 B2 * | 9/2006 | Yeo et al. ................... 257/347 |
| 7,115,945 B2 * | 10/2006 | Lee et al. ................... 257/329 |

FOREIGN PATENT DOCUMENTS

| | | |
|---|---|---|
| JP | 2002-26299 | 1/2002 |
| JP | 2002-289871 | 10/2002 |

OTHER PUBLICATIONS

Fu-Liang Yang et al., 35nm CMOS FinFETs, 2002 Symposium on VLSI Technology Digest of Technical Papers, IEEE, 2002.
Bin Yu et al., FinFET Scaling to 10nm Gate Length, Department of EECS, University of California, Berkeley, CA, IEEE, 2002.

* cited by examiner

*Primary Examiner*—Thanh Nguyen
(74) *Attorney, Agent, or Firm*—Westerman, Hattori, Daniels & Adrian, LLP.

(57) ABSTRACT

A semiconductor device comprises a fin-type semiconductor region (fin) on a support substrate, having a pair of generally vertical side walls and an upper surface coupling the side walls; an insulated gate electrode structure traversing an intermediate portion of the fin and having side walls in conformity with the side walls of the fin; source/drain regions formed in the fin on both sides of the gate electrode; side wall insulating films including a first portion formed on the side walls of the conductive gate electrode and a second portion formed on the side walls of the fin and having an opening in the source/drain regions extending from an upper edge to a lower edge of each of the side walls; a silicide layer formed on each surface of the source/drain regions exposed in the opening of the second side wall insulating film; and source/drain electrodes contacting the silicide layers.

10 Claims, 17 Drawing Sheets

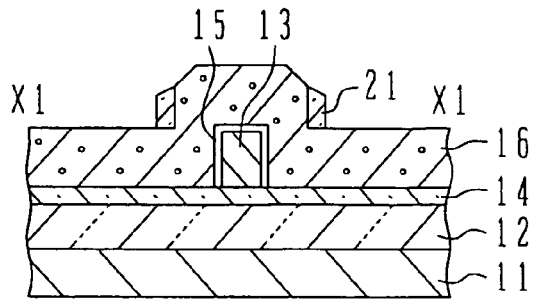
FIG.1N
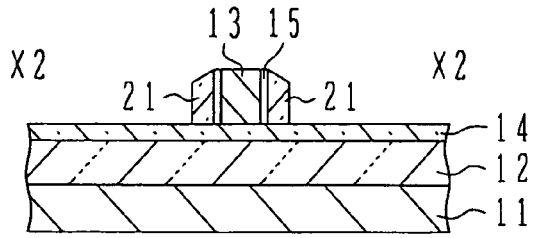
FIG.1O
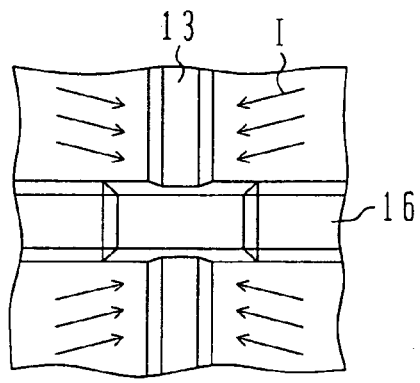
FIG.1P
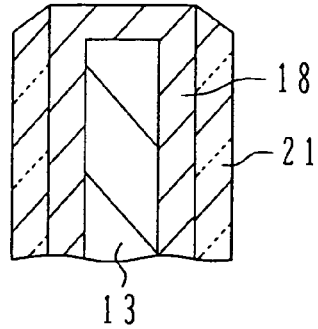
FIG.1Q1
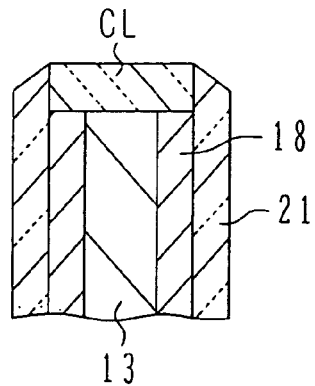
FIG.1Q2

FIG. 5G1 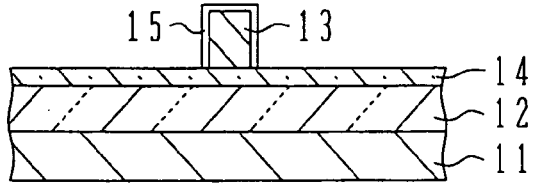
FIG. 5G2 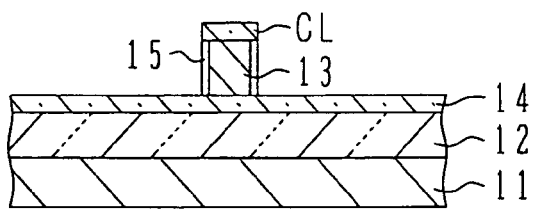

FIN-TYPE SEMICONDUCTOR DEVICE WITH LOW CONTACT RESISTANCE

CROSS REFERENCE TO RELATED APPLICATION

This application is based on and claims priority of Japanese Patent Applications No. 2005-008854 and No. 2005-008855, both filed on Jan. 17, 2005, the entire contents of both of which are incorporated herein by reference.

BACKGROUND OF THE INVENTION

A) Field of the Invention

The present invention relates to a semiconductor device and its manufacture method, and more particularly to a semiconductor device having field effect transistors having a fin-type structure and its manufacture method.

A field effect transistor having a fin-type structure is generally called Fin-FET or double-gate Fin-FET and is a three-dimensional field effect transistor having a channel plane vertical to a substrate plane. A semiconductor protrusion of a thin wall (fin) vertical to the plane of a substrate is formed, a gate insulating film and a gate electrode are formed on each of side walls of the fin, and source/drain regions are formed in the fin on both sides of the gate electrode.

B) Description of the Related Art

A field effect transistor having a fin type structure has a channel plane vertical to the substrate surface so that an occupied area of the substrate can be reduced, dielectric separation is facilitated and adaptability to micro structure and high speed operation can be enhanced. A semiconductor on insulator (SOI) substrate has a silicon layer disposed on an insulating film, and a cap layer of an oxide film, a lamination of an oxide film and a nitride film or the like is formed on the silicon layer of the SOI substrate, and the cap layer and silicon layer are patterned to form a fin of silicon. A gate insulating film of silicon oxide, silicon oxynitride or the like is formed on the fin surface, and thereafter a polysilicon layer is deposited and patterned to form an insulated gate electrode. Impurities are doped in the fin region on both sides of the gate electrodes to form source/drain regions. In this manner, a basic FET structure can be formed.

FIG. 7 shows an example of the structure of Fin-FET. Referring to FIG. 7, the silicon layer of an SOI substrate having an SiN/SiO₂ cap layer is patterned to form a fin 51 and contact regions 52 and 53 having an increased width on both sides of the fin. A sacrificial oxide film is formed on the fin side walls, and the SiN layer together with the sacrificial oxide film are removed. The cap layer 61 is left on the silicon layer. A gate insulating film 62 is formed through oxidation, nitridation or the like. A polysilicon layer is deposited on the substrate and patterned to form a gate electrode 71. A contact region 72 having an increased width is formed at one end of the gate electrode 71. Impurities are doped by ion implantation or the like to form source/drain regions. After the transistor structure is buried in an interlayer insulating film, contact holes reaching the contact areas are formed through the interlayer insulating film, and conductive plugs 80 such as tungsten plugs are buried in the contact holes. The gate electrode resistance can be lowered by using as the gate electrode a lamination of a polysilicon layer and a silicide layer.

For these technologies, refer to "2002 Symposium on VLSI Technology Digest of Technical Papers" by Fu-Liang Yang et al., p. 104, 2002 or "IEDM Tech. Dig." by Bin Yu et al., p. 251, 2002.

The channel of Fin-FET is formed in the silicon layer facing the gate electrode via the gate insulating film. The channel length is determined by the width of the gate electrode (polysilicon layer) and the channel width is determined by the height of the fin. Although the length of the fin is determined by a process precision and the like, the narrow lead regions of the source/drain regions increase the resistance of the source/drain regions. There is a proposal that without broadening the opposite end portions of a fin, opposite end portions of the fin are cut and metal layers are buried to form Schottky contacts (e.g., refer to Japanese Patent Laid-open Publication No. 20002-289871).

SUMMARY OF THE INVENTION

An object of the present invention is to provide a high quality semiconductor device including field effect transistors having a fin-type structure and its manufacture method.

Another object of the present invention is to provide a semiconductor device including field effect transistors having a fin-type structure and having a low contact resistance of source/drain regions and its manufacture method.

According to one aspect of the present invention, there is provided a semiconductor device comprising:

a support substrate having an insulating surface;

a fin-type semiconductor region of a first conductivity type formed on the support substrate, the fin-type semiconductor region having a pair of side walls generally vertical to a surface of the support substrate and an upper surface coupling the side walls;

an insulated gate electrode structure formed traversing an intermediate portion of the fin-type semiconductor region and including a gate insulating film and a conductive gate electrode formed on the gate insulating film, the gate electrode having side walls in conformity with the side walls of the fin-type semiconductor region;

source/drain regions of a second conductivity type opposite to said first conductivity type, formed in the fin-type semiconductor region on both sides of the conductive gate electrode;

side wall insulating films including a first side wall insulating film formed on the side walls of the conductive gate electrode and a second side wall insulating film formed on the side walls of the fin-type semiconductor region and having an opening on each of the source/drain regions, extending from an upper edge to a lower edge of each of the side walls of the fin-type semiconductor region;

a silicide layer formed on a surface of each of the source/drain regions exposed in the opening of the second side wall insulating film; and source/drain electrodes contacting the silicide layers.

According to another aspect of the present invention, there is provided a semiconductor device manufacture method comprising the steps of:

(a) patterning a semiconductor layer of an SOI substrate to form a fin-type semiconductor region on a support substrate having an insulating surface, the fin-type semiconductor region having a pair of side walls generally vertical to a surface of the support substrate and an upper surface coupling the side walls;

(b) forming an insulated gate electrode structure traversing an intermediate portion of the fin-type semiconductor region and including a gate insulating film and a conductive gate electrode formed on the gate insulating film, the gate electrode having side walls in conformity with the side walls of the fin-type semiconductor region;

(c) forming a side wall insulating film on the side walls of the fin-type semiconductor region and on side walls of the insulated gate electrode structure;

(d) forming source/drain regions in the fin-type semiconductor region on both sides of the conductive gate electrode;

(e) depositing an interlayer insulating film covering the side wall insulating films;

(f) opening contact holes through the interlayer insulating film, the contact holes reaching the source/drain regions, and removing the side wall insulating films in the contact holes to expose the source/drain regions; and (g) forming a silicide layer on semiconductor surfaces in the contact holes.

The side wall insulating film is formed on the side walls of the gate electrode, whereas the sidewall insulating film is removed from the contact areas of the source/drain regions and the silicide layer is formed on the side walls of silicon. It is therefore possible to lower the contact resistance of the source/drain regions.

According to still another aspect of the present invention, there is provided a semiconductor device comprising:

a support substrate having an insulating surface;

a fin-type semiconductor region of a first conductivity type formed on the support substrate, the fin-type semiconductor region having a pair of side walls having a first height and being generally vertical to a surface of the support substrate and an upper surface coupling the side walls;

an insulated gate electrode structure formed traversing an intermediate portion of the fin-type semiconductor region and including a gate insulating film and a conductive gate electrode formed on the gate insulating film, the gate electrode having side walls having a second height higher than the first height;

source/drain regions of a second conductivity type opposite to said first conductivity type, formed in the fin-type semiconductor region on both sides of the insulated gate electrode structure;

side wall insulating films not formed on the upper surface and the side walls of the fin-type semiconductor region but formed on lower portions of the side walls of the gate electrode near the fin-type semiconductor region, the side wall insulating films surrounding the upper surface and the side walls of the fin-type semiconductor region;

a silicide layer formed at least on each of the side walls, from upper edges to lower edges thereof, of a portion of the fin-type semiconductor region protruding from the side wall insulating films; and source/drain electrodes contacting the silicide layers on the side walls of the fin-type semiconductor region.

According to still another aspect of the present invention, there is provided a semiconductor device manufacture method comprising the steps of:

(a) patterning a semiconductor layer of an SOI substrate to form a fin-type semiconductor region on a support substrate having an insulating surface, the fin-type semiconductor region having a pair of side walls having a first height and being generally vertical to a surface of the support substrate and an upper surface coupling the side walls;

(b) forming an insulated gate electrode structure traversing an intermediate portion of the fin-type semiconductor region and including a gate insulating film and a conductive gate electrode formed on the gate insulating film, the gate electrode having side walls having a second height higher than the first height;

(c) forming a side wall insulating film covering the fin-type semiconductor region and the insulated gate electrode structure;

(d) forming source/drain regions in the fin-type semiconductor region on both sides of the insulated gate electrode structure;

(e) anisotropically etching the side wall insulating film to completely remove the side wall insulating film from the upper surface and the side walls of the fin-type semiconductor region, to remove the side wall insulating film from the upper surface and upper portions of the side walls of the gate electrode, and to leave the side wall insulating film on lower portions of the side walls of the gate electrode near the fin-type semiconductor region, the left side wall insulating film surrounding the upper surface and the side walls of the fin-type semiconductor region;

(f) forming a silicide layer at least on the exposed side walls, from upper edges to lower edges thereof, of the fin-type semiconductor region;

(g) depositing an interlayer insulating film covering the fin-type semiconductor region and the gate electrode;

(h) forming contact holes through the interlayer insulating film, the contact holes exposing the silicide layers on the side walls of the fin-type semiconductor region; and (i) burying conductive plugs in the contact holes.

The side wall insulating film is formed on the lower portions of the side walls of the gate electrode, surrounding the fin-type semiconductor region, whereas the sidewall insulating film is completely removed from the fin-type semiconductor region and the silicide layer is formed at least on the side walls of the fin-type semiconductor region. It is therefore possible to lower the contact resistance of the source/drain regions.

DESCRIPTION OF THE PREFERRED EMBODIMENTS

Embodiments of the present invention will be described with reference to the accompanying drawings.

Figure 1A:
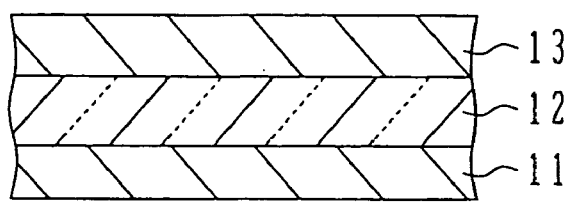
FIGS. 1A to 1Y are cross sectional views, plan views and a perspective view illustrating manufacture processes for a semiconductor device according to an embodiment of the invention.
Figure 1B:
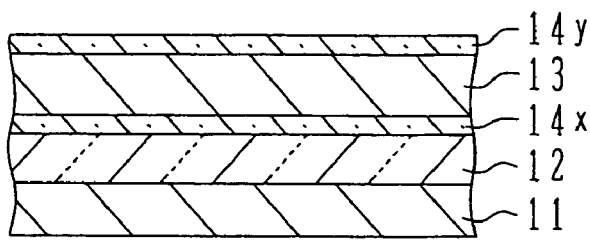
Figure 1B:
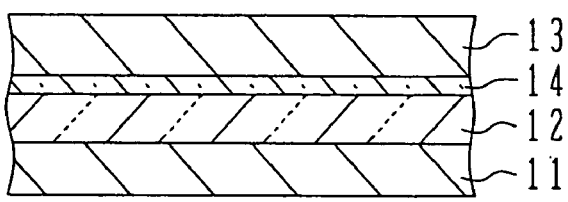
Figure 1B:
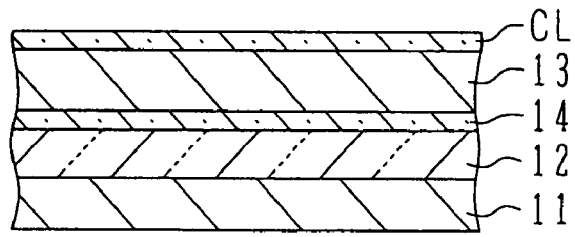
Figure 1D:
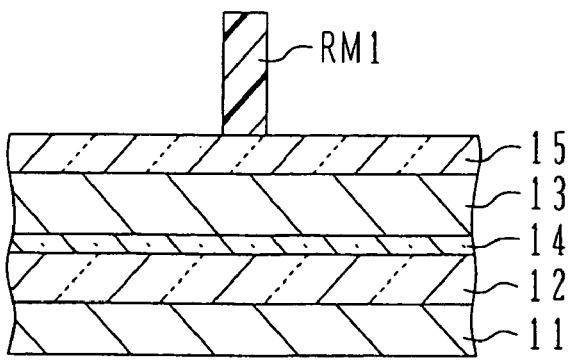
Figure 1E:
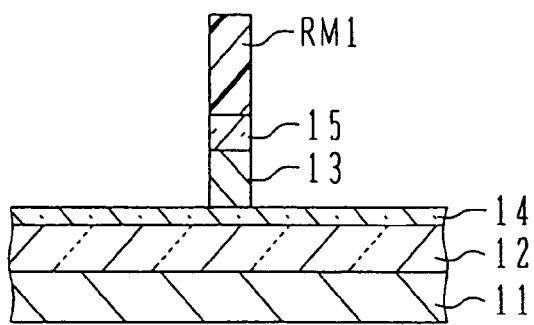
Figure 1F:
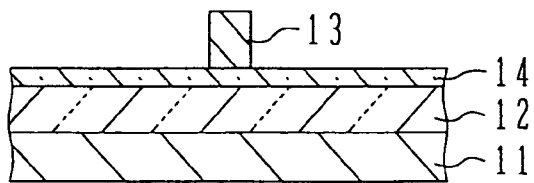
Figure 1F:
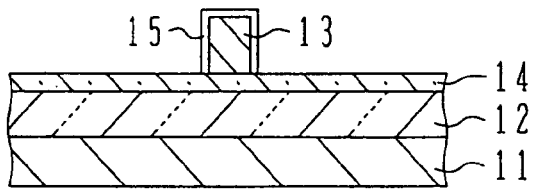
Figure 1F:
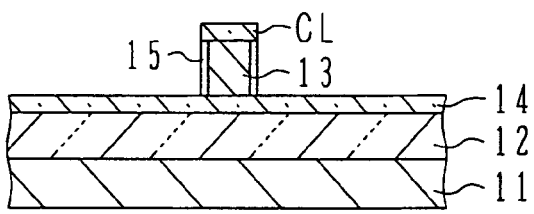
Figure 1H:
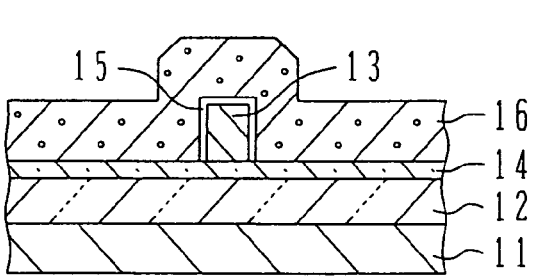
Figure 1I:
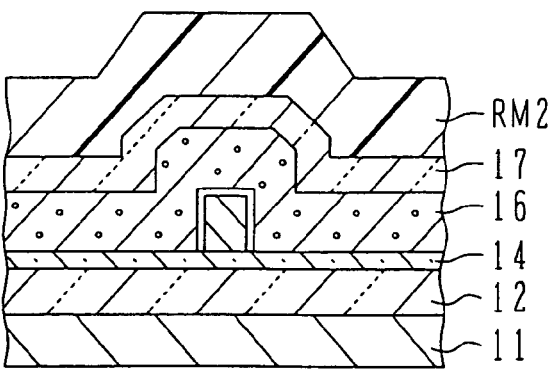
Figure 1J:
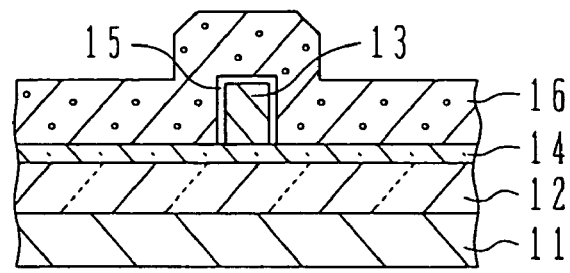
Figure 1K:
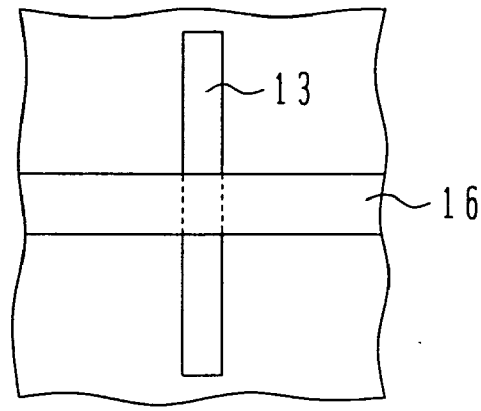
Figure 1L:
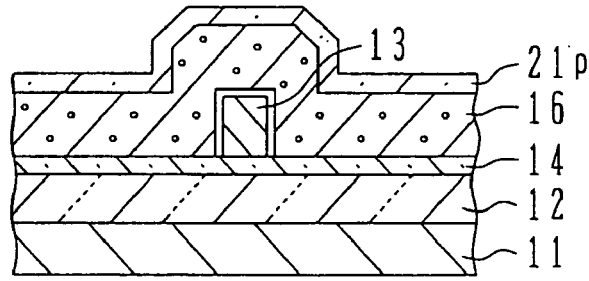
Figure 1M:
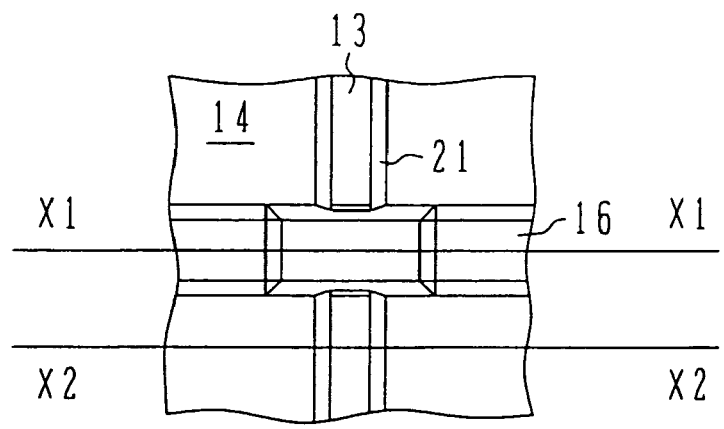
Figure 1R:
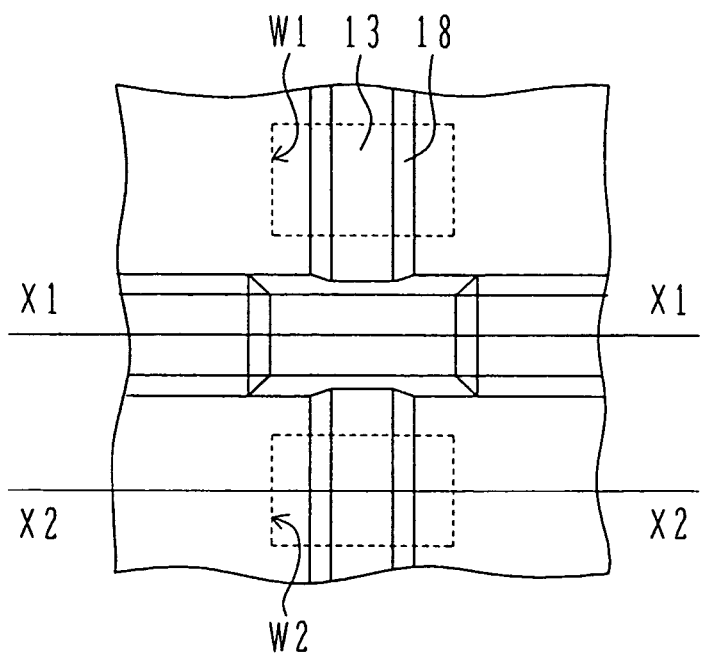
Figure 1S:
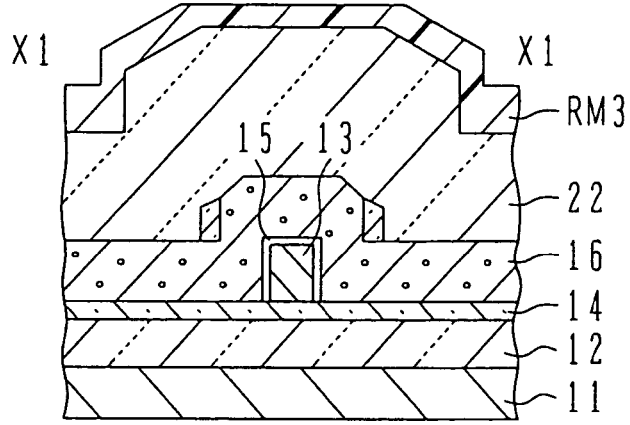
Figure 1T:
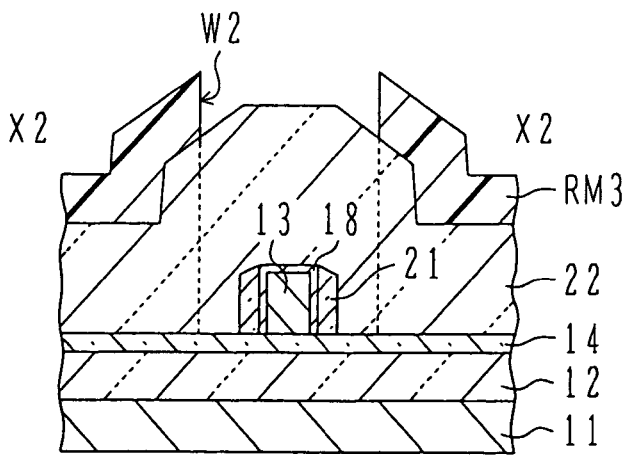
Figure 1U:
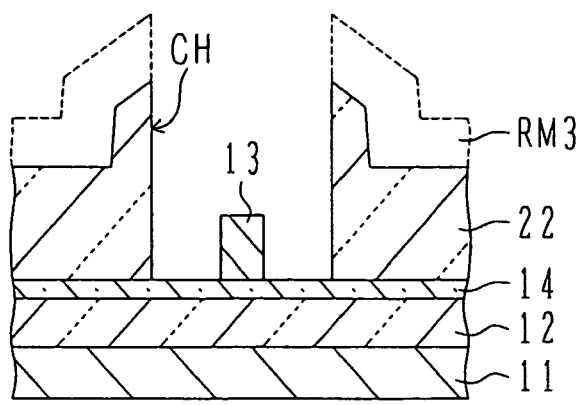
Figure 1V:
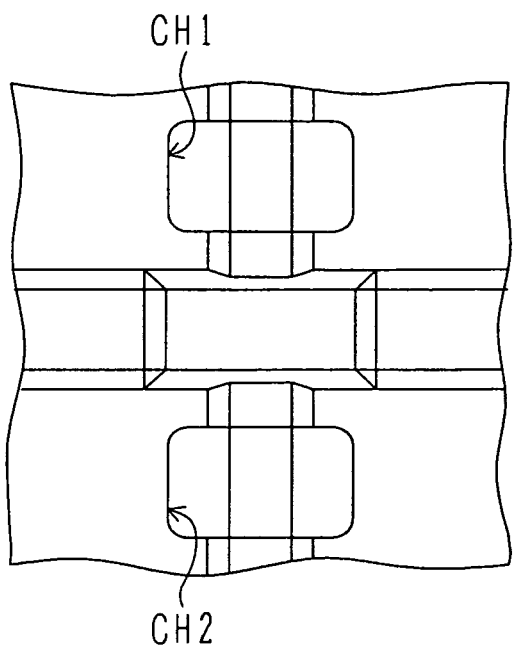
Figure 1V:
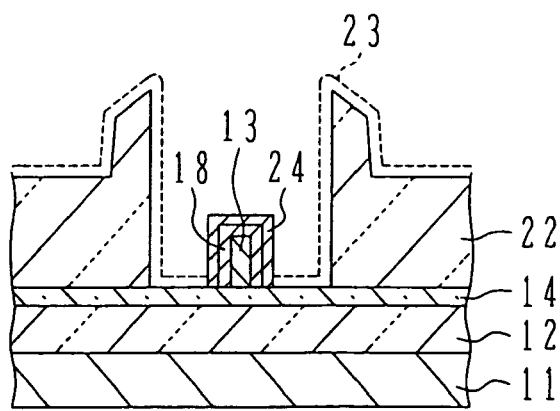
Figure 1V:
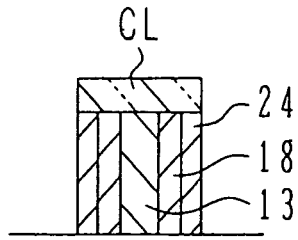
Figure 1X:
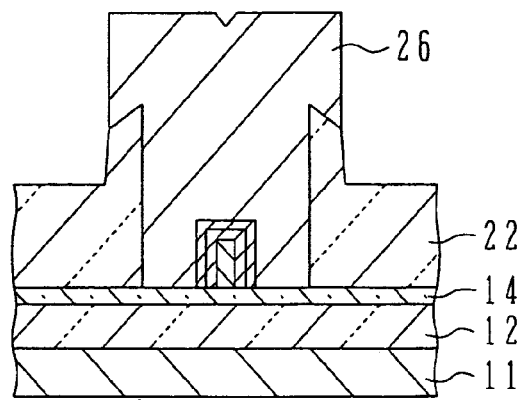
Figure 1Y:
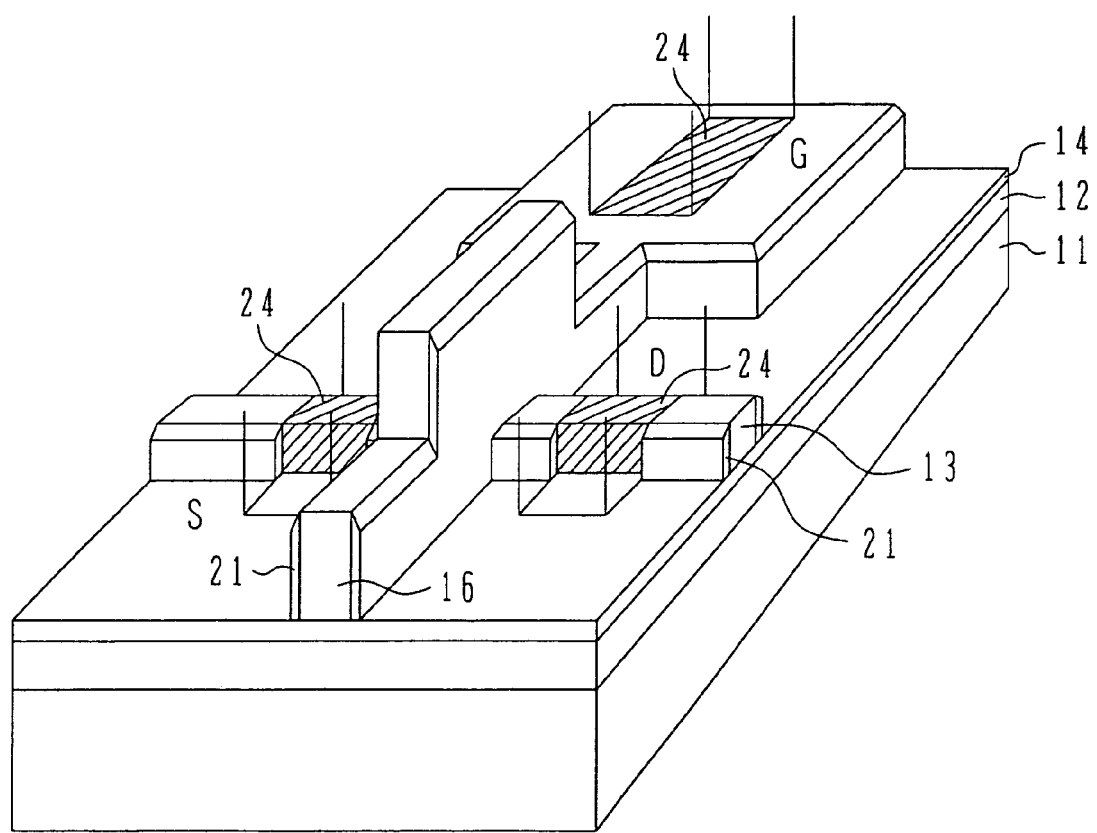

FIGS. 1A to 1Y are cross sectional views, plan views and a perspective view illustrating manufacture processes for a semiconductor device including field effect transistors having a fin-type structure according to an embodiment of the invention.

As shown in FIG. 1A, an SOI substrate is prepared which has a buried silicon oxide layer 12 formed on a silicon support substrate 11 and a thin oxide film 13 formed on the buried silicon oxide layer. A thickness of the silicon layer 13 which is used for forming semiconductor elements is adjusted to be, for example, 100 nm. This silicon layer thickness is equal to a height of a fin-type region to be later formed, and determines the channel width of a fin-type field effect transistor.

As shown in FIG. 1B, the SOI substrate is heated to 800° C. to 1000° C. and annealed for 5 min. to 60 min in an atmosphere of $N_2$, NO, $NH_3$, $NF_3$, $N_2O$, nitrogen activated by electron cyclotron resonance (ECR) or the like. A silicon nitride film 14x is therefore formed at the interface between the silicon layer 13 and buried oxide film 12, and a silicon nitride film 14y is also formed on the surface of the silicon layer 13. The silicon nitride film 14x has an etch stopper function. For heat treatment in the nitridizing atmosphere, refer to Japanese Patent Laid-open Publication No. 2002-26299, paragraphs [0016] to [0026], which is incorporated herein by reference.

As shown in FIG. 1C1, the silicon nitride film 14y on the surface of the silicon layer 13 is removed by hot phosphoric acid or the like.

As shown in FIG. 1C2, a cap layer CL may be formed on the silicon layer 13, the cap layer being a lamination of a silicon oxide layer and a silicon nitride layer. The silicon nitride layer 14y shown in FIG. 1B may be used as the cap layer. Although the following description will be made by taking as an example mainly the structure without the cap layer CL, the structure with the cap layer CL will be described where appropriate.

As shown in FIG. 1D, a silicon oxide layer 15 is deposited on the silicon layer 13 by CVD to a thickness of, for example, 10 nm to 20 nm. This silicon oxide layer is used as a hard mask layer functioning as a mask when the underlying layer is etched. A resist mask RM1 is formed on the silicon oxide layer 15. This resist mask RM1 is used when the silicon layer 13 is etched to form a fin. A width of the fin is, for example, about 20 nm. By using the resist mask RM1 as an etching mask, the hard mask layer 15 is etched, and in succession the silicon layer 13 is etched by using the resist mask RM1 and hard mask layer 15 as a mask.

As shown in FIG. 1E, the silicon layer 13 is therefore etched in conformity with the shape of the initial resist mask RM1. The silicon nitride layer 14 under the silicon layer 13 functions as an etch stopper.

As shown in FIG. 1F, the resist mask RM1 and hard mask layer 15 are removed through washing in acid containing solution.

As shown in FIG. 1G1, an oxidation process is executed at a temperature of 800° C. to 1200° C. in an atmosphere of oxygen containing gas to form a gate insulating film having a thickness of 0.6 nm to 2 nm on the surface of the silicon layer 13. Thereafter, a nitridization process is executed at a temperature of 800° C. to 1200° C. in an atmosphere of nitrogen containing gas to change the gate insulating film to an oxynitride film. As the nitrogen containing gas, the nitridizing atmosphere of $N_2$, NO, $NH_3$, $NF_3$, $N_2O$ and the like described above may be used. In this manner, the gate insulating film 15 of oxynitride is formed on the upper surface and side walls of the silicon layer 13.

As shown in FIG. 1G2, if the cap layer CL is used, the gate insulating film 15 is formed only on the side walls of the silicon layer 13.

As shown in FIG. 1H, a polysilicon layer 16 is deposited by CVD to a thickness of about 100 nm, covering the fin-type structure. A height of the polysilicon layer 16 is about 200 nm on the fin-type semiconductor region and its nearby area.

As shown in FIG. 1I, a silicon oxide layer 17 is formed on the polysilicon layer 16 by CVD to a thickness of 10 nm to 20 nm to form a hard mask layer similar to that described earlier. A resist mask RM2 for etching the polysilicon layer 16 is formed on the silicon oxide layer 17. The resist mask RM2 is used for etching a gate electrode, and a width thereof is set to 100 nm or narrower, e.g., 50 nm, this width determining the gate length. By using the resist mask RM2 as an etching mask, the hard mask layer 17 is etched, and the polysilicon layer 16 is etched by using the resist mask RM2 and hard mask layer 17 as a mask. The resist mask RM1 and hard mask layer 17 are thereafter removed through washing in acid containing solution.

As shown in FIGS. 1J and 1K, a polysilicon gate electrode 16 is therefore formed traversing an intermediate portion of the fin-type semiconductor region 13. FIG. 1J is a cross sectional view cut through the gate electrode, and FIG. 1K is a plan view of the substrate after the gate electrode 16 is formed. The polysilicon gate electrode 16 having a width of about 50 nm is therefore formed traversing the intermediate portion of the fin-type semiconductor region 13 having a width of about 20 nm.

As shown in FIG. 1L, a silicon oxide layer 21p having a thickness of 10 nm to 20 nm is deposited on the whole substrate surface by CVD. Next, reactive ion etching (RIE) is executed to remove the silicon oxide layer 21p on the flat surface. The silicon oxide layer 21p is left only on the side walls generally vertical to the substrate surface.

FIGS. 1M, 1N and 1O are a plan view and cross sectional views taken along lines X1-X1 and X2-X2 showing side wall insulating films 21 of silicon oxide. The side wall insulating films of silicon oxide are formed on the side walls of the gate electrode 16 and fin-type semiconductor region.

As shown in FIG. 1P, ion implantation is performed obliquely into the fin-type silicon region 13 to form extension regions and high concentration regions of source/drain regions. If necessary, ion implantation is performed to form pocket regions of an opposite conductivity type. The ion implantation processes may be executed by well-known methods. For example, ion implantation may be executed for the extension and pocket regions before the side wall insulating films 21 are formed, and ion implantation is executed for the high concentration regions after the side wall insulating films 21 are formed.

FIG. 1Q1 shows a cross section of the source/drain region 18 formed in the fin-type silicon region 13 without the cap layer. In the case of an n-channel MOS transistor, an n-type source/drain region 18 is formed on the upper surface and side walls of the p-type fin-type silicon region 13.

FIG. 1Q2 shows a cross section of the source/drain region 18 with the cap layer CL. The source/drain region 18 is formed only on the side walls of the fin-type silicon region 13. After the ion implantation, annealing is performed at a temperature of 800° C. to 1200° C. to activate implanted impurity ions.

With the processes described above, a fundamental FET structure is formed having the polysilicon gate electrode 16 traversing the fin-type silicon region 13 and the source/drain regions formed on both sides of the polysilicon gate electrode 16.

FIGS. 1R, 1S and 1T show an interlayer insulating film 22 such as a silicon oxide film, a PSG film and a BPSG film deposited covering the fin-type FET structure and a resist mask RM3 for opening contact holes formed on the interlayer insulating film. FIGS. 1S and 1T are cross sectional views taken along lines X1-X1 and X2-X2. The interlayer insulating film 22 has a thickness of, for example, 200 nm to 1000 nm, and may be formed by CVD or sputtering. Although the interlayer insulating film 22 is shown having a concave/convex portion reflecting the underlying layer, a thick interlayer insulating film may be formed and planarized by chemical mechanical polishing (CMP) or the like to form the resist mask RM3 on the planarized surface. The resist mask RM3 has windows W1 and W2 in the areas corresponding to contact areas to the source/drain regions of the fin-type semiconductor region 13. By using the resist mask RM3 as an etching mask, the interlayer insulating film 22 is etched by RIE. At the same time when the interlayer insulating film 22 of silicon oxide is etched, the side wall insulating films 21 of silicon oxide are etched.

FIG. 1U shows the state that a contact hole CH is etched through the interlayer insulating film and the side wall insulating films are also removed to expose the fin-type semiconductor region 13. The contact hole CH may be etched by RIE using fluorine containing gas as reactive gas, e.g., $CF_4$, $CHF_3$, $C_2F_6$ and $C_4F_8$ under the conditions of a pressure of 1 Pa to 100 Pa and RF power at 13.56 MHz. Etching of silicon oxide is stopped at the silicon nitride layer 14. After the etching, wet etching is performed by using aqueous solution of dilute hydrofluoric acid to completely remove an oxide film on the surface of the silicon layer 13. FIG. 1V is a plan view showing the state that contact holes CH1 and CH2 are formed. The side wall insulating films of silicon oxide in the contact holes are removed and the upper surface and side walls of the fin-type silicon regions 13 are exposed.

As shown in FIG. 1W1, a metal layer 23 capable of being silicidated such as Co and Ni is deposited by sputtering to a thickness of, e.g., 2 nm to 30 nm, and a primary silicidation reaction is performed by annealing at 200° C. to 600° C. With this primary silicidation reaction, the metal layer 23 deposited on the silicon layer changes to a silicide layer 24. The unreacted metal layer 23 is removed by an acid solution process or the like, and a secondary silicidation reaction is performed by annealing at 300° C. to 900° C. to form a low resistance silicide layer 24.

FIG. 1W2 shows the cross sectional structure with the cap layer CL. Since the cap layer CL of silicon nitride is formed on the upper surface of the fin-type silicon region, the silicide layer 24 is formed only on the side walls of the fin-type structure.

As shown in FIG. 1X, a barrier layer of Ti, TiN or the like is deposited by sputtering or CVD to a thickness of 5 nm to 20 nm, and a W layer is deposited on the barrier layer by CVD to bury a tungsten plug 26 in the contact hole. Thereafter, the tungsten layer is patterned by well-known methods such as CMP and etching to form lead wires. If necessary, an interlayer insulating film forming process and a wiring layer forming process are repeated to complete a semiconductor device.

FIG. 1Y is a perspective view of the fin-type FET structure at the stage when the silicide layer 24 is formed. The gate electrode has an increased width at its one end, and a contact hole is formed at this position to form the silicide layer 24. The fin-type silicon region 13 extends in the horizontal direction in FIG. 1Y. The contact holes are formed and the side wall insulating films 21 in the contact holes are removed to form the silicide layer 24 covering the upper surface and side walls. If the cap layer is formed, the silicide layer 24 is formed on the side walls of the fin-type silicon region 13.

If the width of the fin-type region is narrower than the height thereof and a contact is formed only on the upper surface, it is difficult to lower sufficiently the contact resistance. In this embodiment, the silicide layer is formed on the side walls of the fin-type silicon region and on the upper surface thereof if the cap layer is not used. Since the source/drain electrodes are connected to the silicide layers, it is possible to lower the source/drain contact resistance and the series resistance between the source/drain regions.

In this embodiment, the nitridation process is performed via the silicon layer 13 to form the silicon nitride layer at the interface between the silicon layer and buried oxide film. This silicon nitride layer forming process may be omitted if an SOI substrate having a buried insulated layer of silicon nitride or silicon oxynitride is used.

Figure 2A:
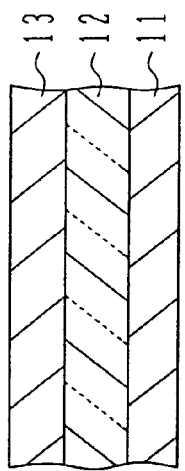
FIGS. 2A to 2D are cross sectional views and a perspective view showing a modification of the embodiment.

As shown in FIG. 2A, an SOI substrate is prepared having a silicon support substrate 11, a buried oxide film 12 and a silicon crystal layer 13. A silicon nitride film forming process is not executed.

Figure 2B:
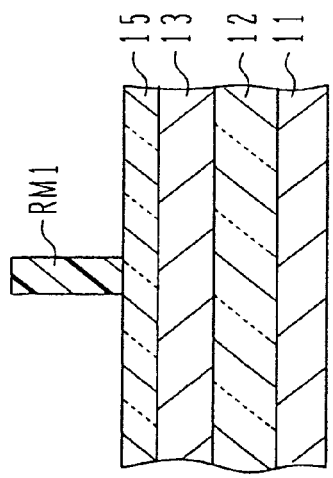

As shown in FIG. 2B, a silicon oxide layer 15 is deposited on the silicon layer 13 by CVD, and a resist mask RM1 for etching the silicon layer 13 is formed on the silicon oxide layer 15.

Figure 2C:
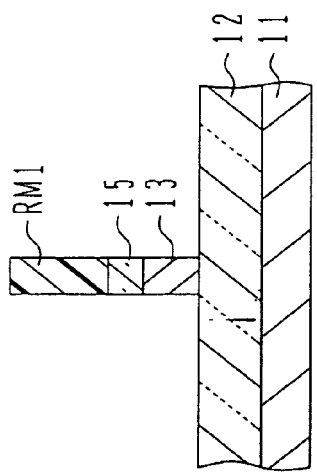
Figure 2D:
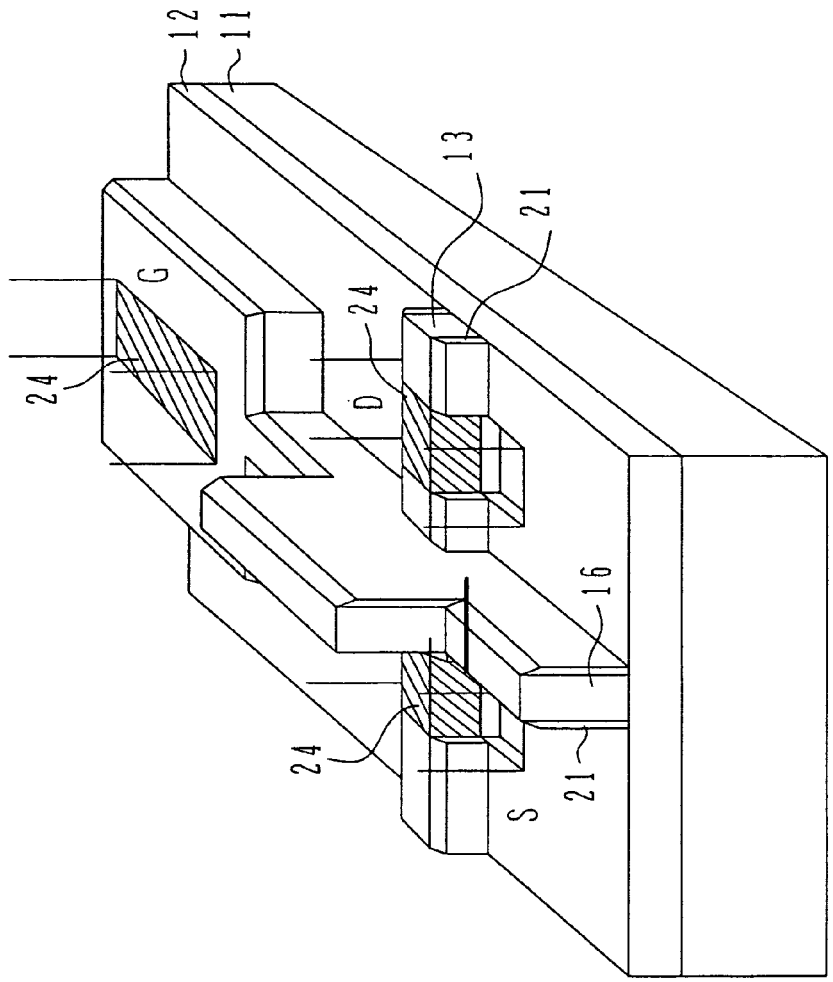

As shown in FIG. 2C, similar to the above-described embodiment, by using the resist mask RM1 as a mask, the hard mask layer 15 is etched, and the silicon layer 13 is etched by using the hard mask layer 15 and resist mask RM1 as a mask, to form a fin-type structure. This state corresponds to that shown in FIG. 1E. Thereafter, the processes similar to the above-described embodiments are executed, and after an interlayer insulating film is formed, contact holes are formed through the interlayer insulating film by etching. During etching the interlayer insulating film, since the silicon nitride layer functioning as an etch stopper does not exist on the substrate surface, the buried silicon oxide layer 12 is etched and a concave portion is formed in the contact hole. This state is shown in FIG. 2D.

Figure 3D:
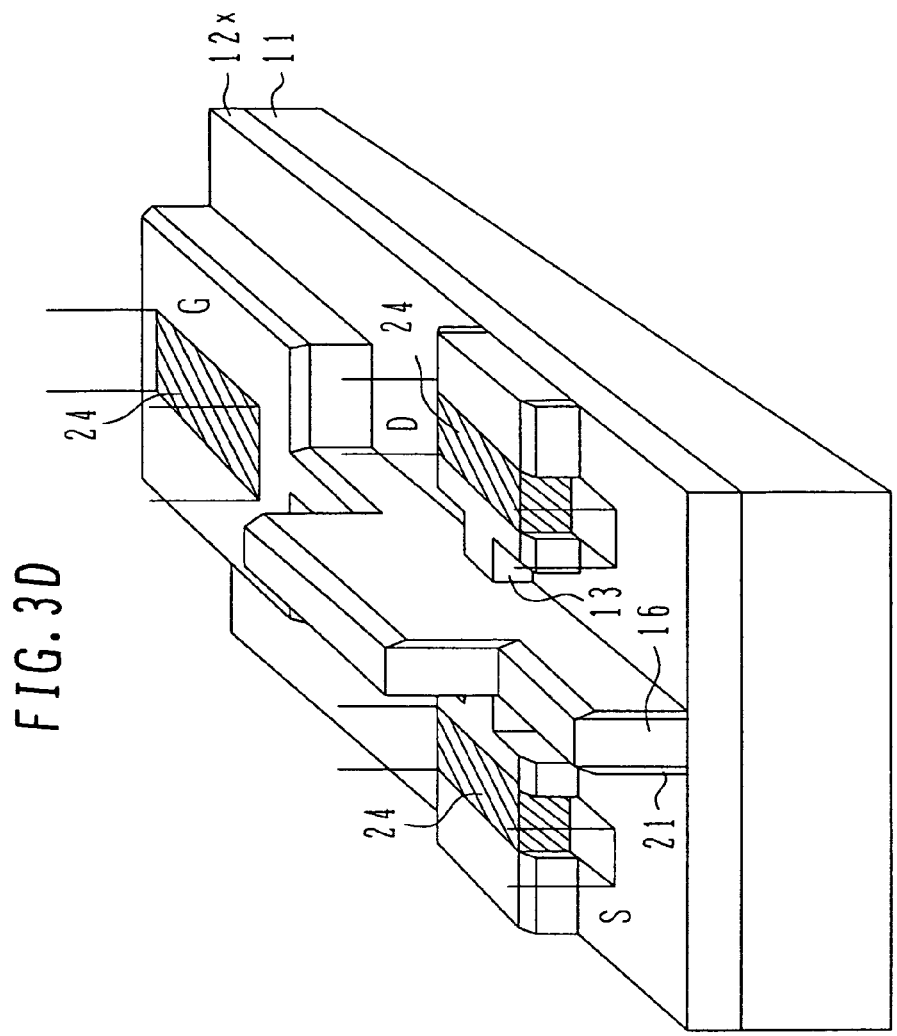
FIGS. 3A to 3D are cross sectional views and a perspective view showing another modification of the embodiment.
Figure 3A:
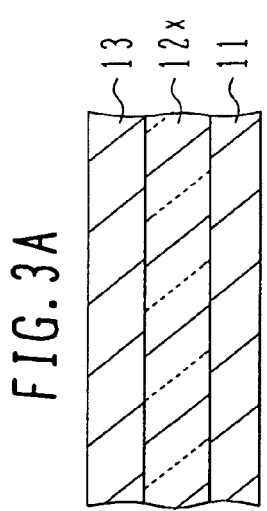
Figure 3B:
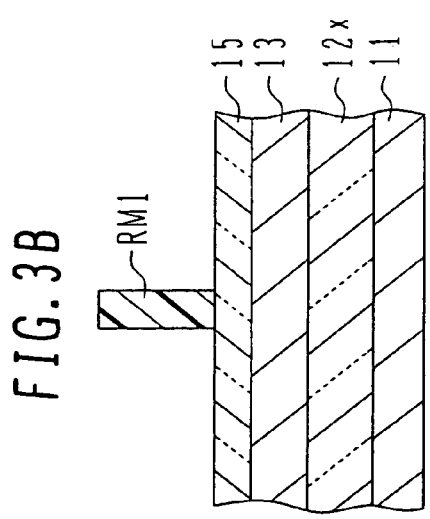
Figure 3C:
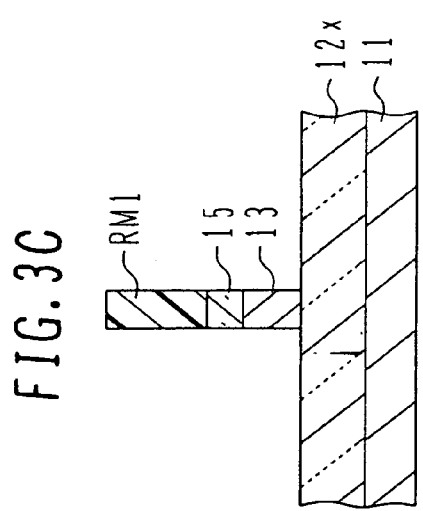

FIGS. 3A to 3D show another modification. An SOI substrate is used whose buried insulating layer is not made of a silicon oxide layer but made of a silicon nitride or silicon oxynitride layer 12x. In this case, even if the silicon nitride layer is not formed, the buried insulating layer 12x itself functions as an etch stopper. FIGS. 3A to 3C illustrate the processes corresponding to those shown in FIGS. 2A to 2C.

As shown in FIG. 3D, the plan shape of a fin-type silicon region 13 is made broad in the contact areas of source/drain regions. Silicide layers 24 are formed in the broad contact areas, and lead electrodes are formed on the silicide layers. If the width of the fin-type structure is narrow and the silicide layer is formed on the side walls of the fin-type structure in the contact areas of the source/drain regions, the silicide layers contact each other in some cases. Silicide has a low resistance in the state that a silicidation reaction with metal is performed sufficiently. If the silicide layers on the side walls contact, silicon becomes insufficient in some cases. In this case, the resistance of the silicide layer cannot be lowered sufficiently. This possibility can be eliminated by broadening the contact region, and a silicide layer having a sufficiently low resistance can be formed.

Figure 4A:
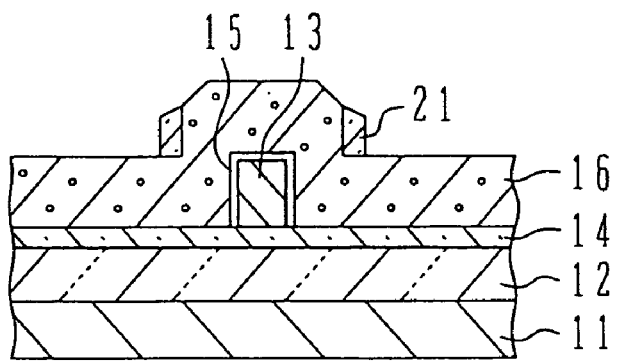
FIGS. 4A to 4D are cross sectional views showing another modification of the embodiment.
Figure 4B:
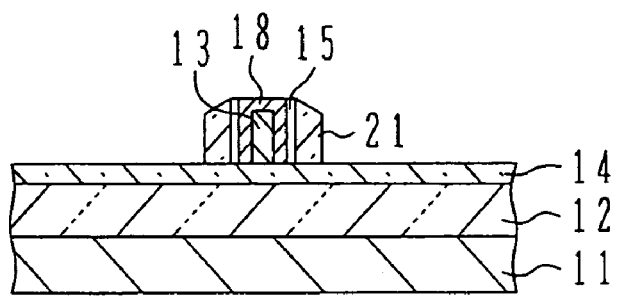

FIGS. 4A to 4D show still another modification. FIGS. 4A and 4B are cross sectional views showing the state that side wall insulating layers 21 are formed. FIG. 4A is the cross sectional view of the region where a gate electrode 16 is formed, and FIG. 4B is the cross sectional view of the source/drain region away from the gate electrode. In this state, the upper surfaces of the silicon layer 13 in the source/drain regions are exposed and the flat upper surface of the gate electrode 16 is also exposed. Source/drain regions 18 are formed by oblique ion implantation or the like.

Figure 4C:
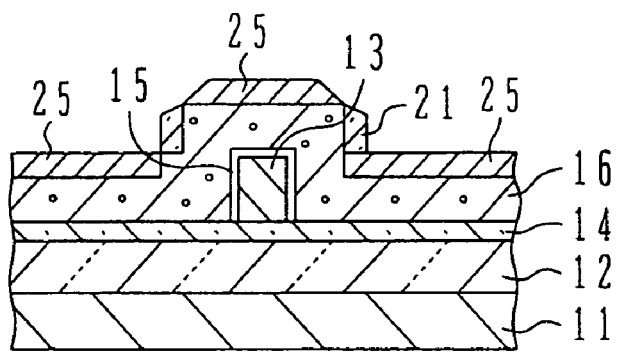
Figure 4D:
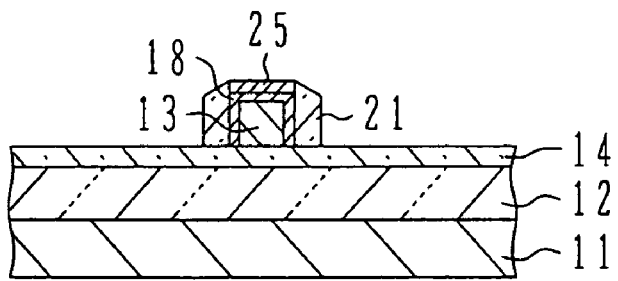

FIGS. 4C and 4D show the state after a silicidation reaction is performed. A silicide layer 25 is formed on the exposed silicon layer.

Thereafter, interlayer insulating film deposition, contact hole formation and silicidation processes are executed so that a silicide layer is formed in an area where the side wall insulating layers 21 existed. Two silicidation processes are therefore executed relative to the upper surface of the fin-type silicon region.

Figure 5A:
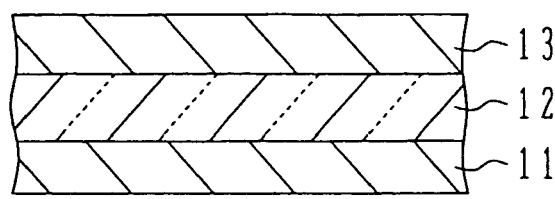
FIGS. 5A to 5T are cross sectional views, a plan view and perspective views illustrating manufacture processes for a semiconductor device according to another embodiment of the invention.
Figure 5B:
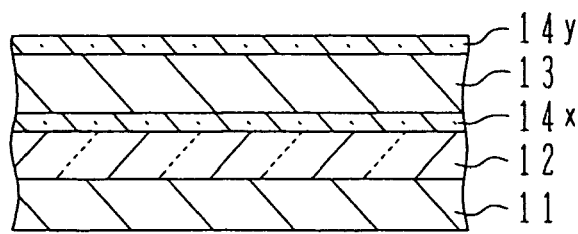
Figure 5B:
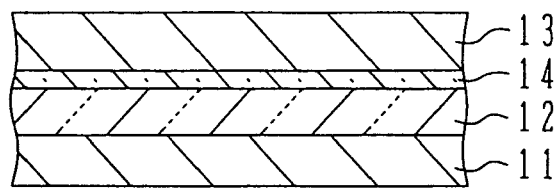
Figure 5B:
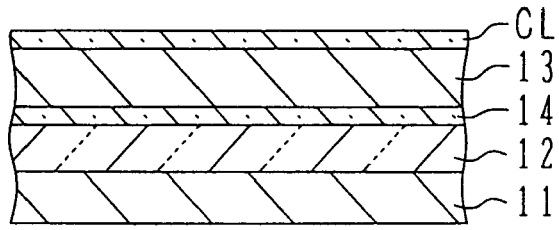
Figure 5D:
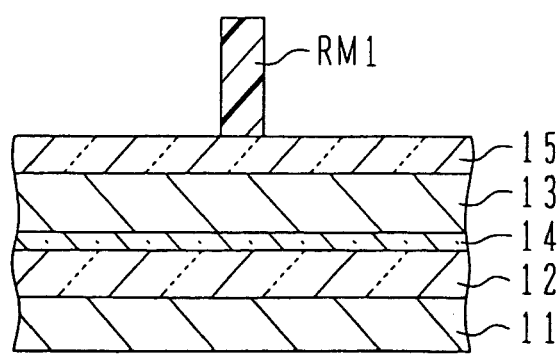
Figure 5E:
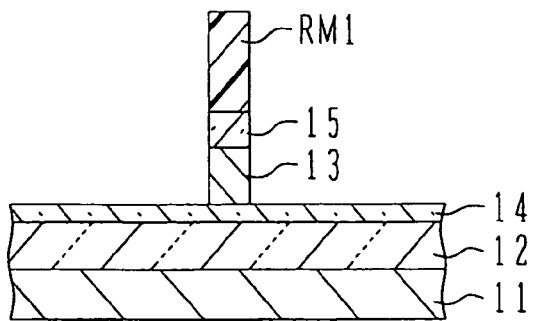
Figure 5F:
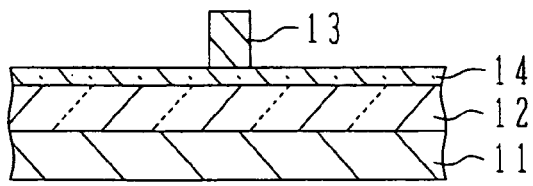
Figure 5H:
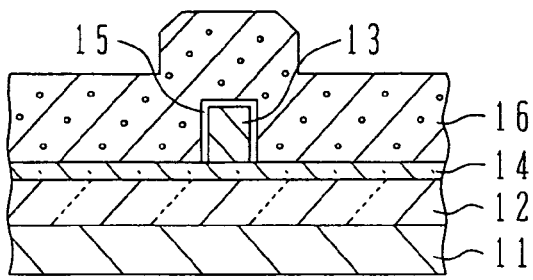
Figure 5I:
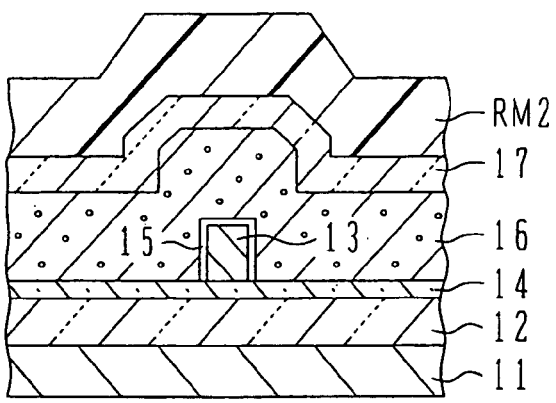
Figure 5J:
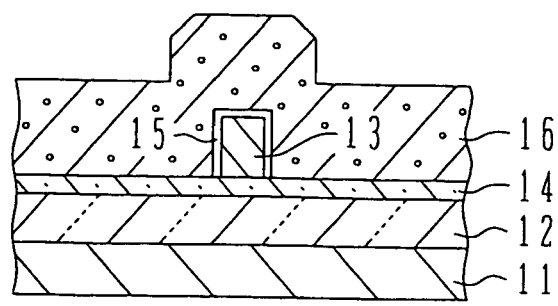
Figure 5K:
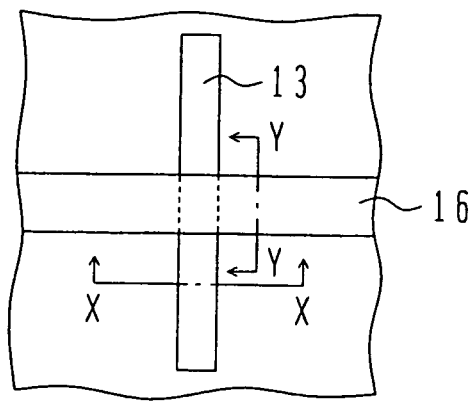
Figure 5L:
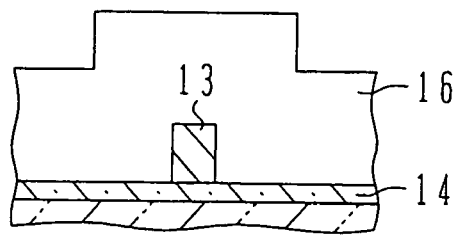
Figure 5L:
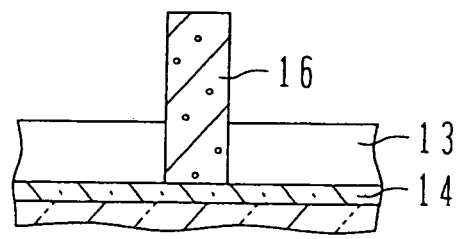
Figure 5M:
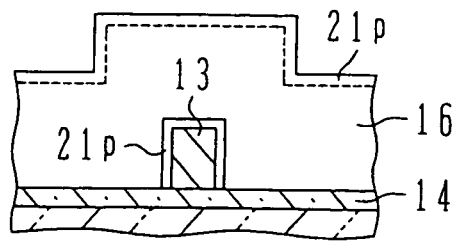
Figure 5M:
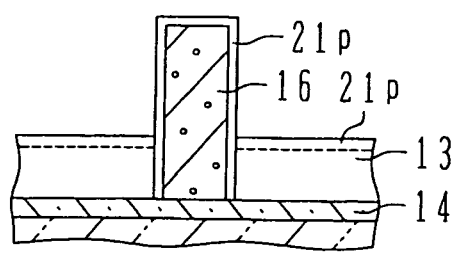
Figure 5N:
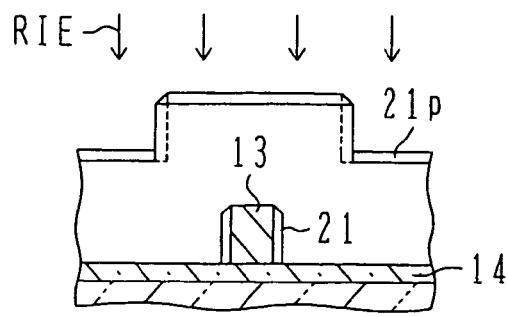
Figure 5N:
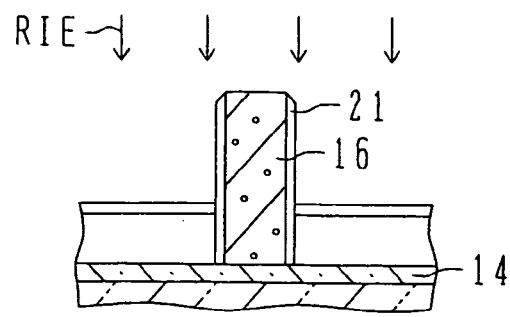
Figure 5O:
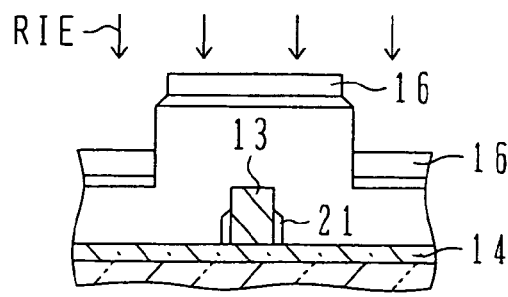
Figure 5O:
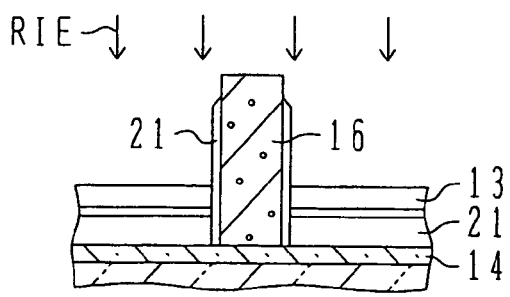
Figure 5P:
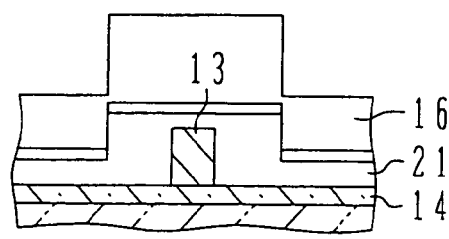
Figure 5P:
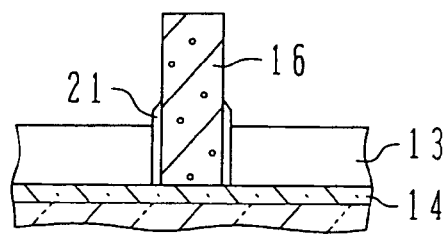
Figure 5Q:
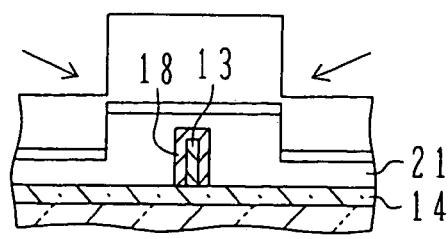
Figure 5Q:
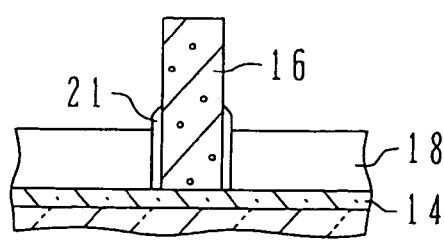
Figure 5R:
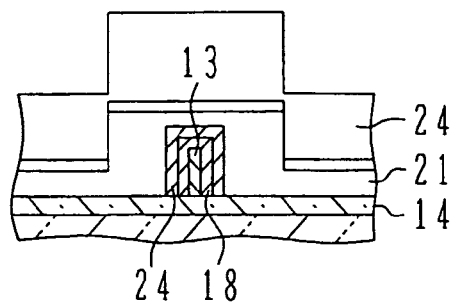
Figure 5R:
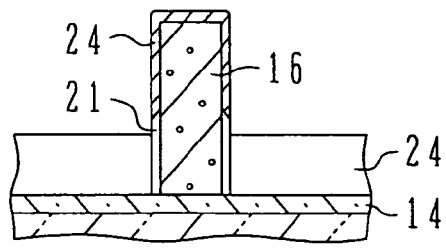
Figure 5S:
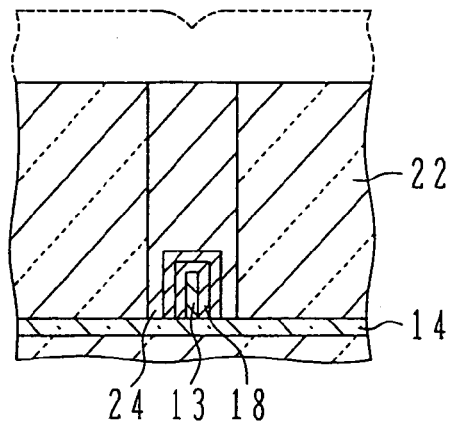
Figure 5S:
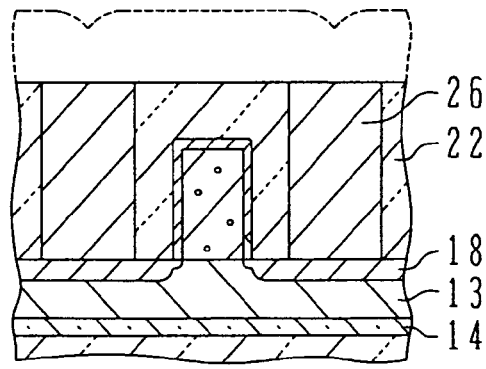
Figure 5T:
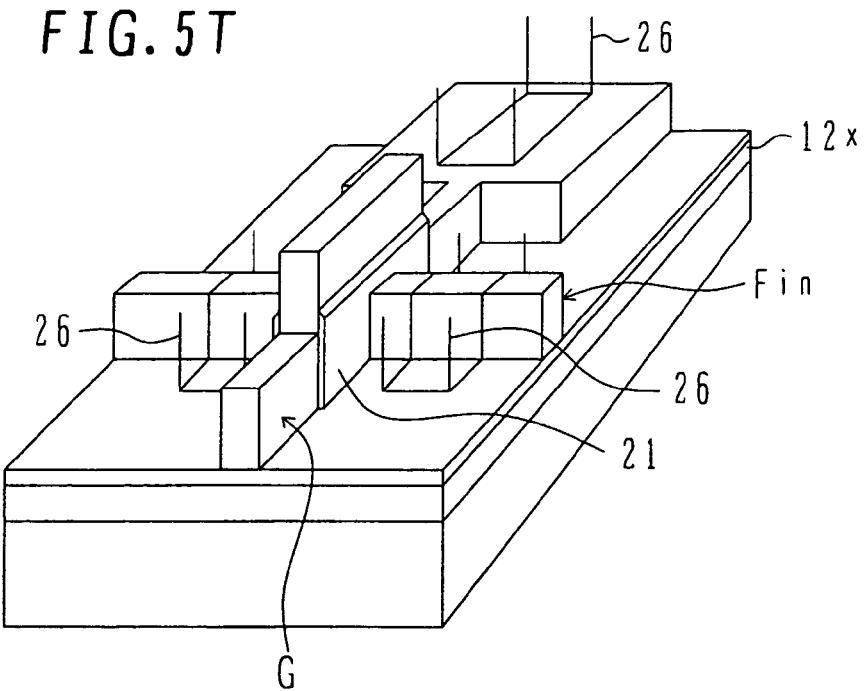

FIGS. 5A to 5T are cross sectional views, a plan view and a perspective view illustrating manufacture processes for a semiconductor device including field effect transistors having a fin-type structure according to another embodiment of the invention.

FIGS. 5A to 5G2 illustrate the processes similar to those shown in FIG. 1A to 1G2. The description thereof is omitted.

As shown in FIG. 5H, a polysilicon layer 16 having a height higher than that of a fin is deposited by CVD to a thickness of, e.g., about 120 nm to 200 nm, covering the fin-type structure. A height of the polysilicon layer 16 is about 220 nm to 300 nm on the fin-type semiconductor region and its nearby area.

The processes shown in FIGS. 5I to 5K are similar to those shown in FIG. 1I to 1K.

As shown in FIGS. 5J and 5K, a gate electrode 16 is formed traversing the intermediate portion of the fin-type semiconductor region 13. FIG. 5J is a cross sectional view cut through the gate electrode, and FIG. 5K is a plan view showing the state that the gate electrode 16 is formed. The polysilicon electrode 16 having a width of about 50 nm is formed traversing the intermediate portion of the fin-type semiconductor region 13 having a width of about 20 nm.

The following description will be made using a cross sectional views X-X and Y-Y in FIG. 5K. The suffix X of the drawing number represents the cross sectional view X-X, and the suffix Y represents the cross sectional view Y-Y.

FIGS. 5LX and 5LY are schematic diagrams showing the states of FIGS. 5J and 5K. The gate electrode 16 higher than the fin is formed traversing the intermediate portion of the fin-type semiconductor region 13.

As shown in FIGS. 5MX and 5MY, a silicon oxide film 21p having a thickness of 10 nm to 20 nm is deposited on the whole substrate surface by CVD.

As shown in FIGS. 5NX and 5NY, reactive ion etching (RIE) is performed to anisotropically etch the silicon oxide layer 21p, for example, using fluorine containing reactive gas, e.g., $CF_4$, $CHF_3$, $C_2F_6$ and $C_4F_8$ under the conditions of a pressure of 1 Pa to 100 Pa and RF power at 13.56 MHz. FIGS. 5NX and 5NY show the state that the silicon oxide layer on the flat surface is etched and a silicon oxide layer 21 is left only on the side walls generally vertical to the substrate surface. Usual side wall spacers take this state.

As shown in FIG. 5OX and 5OY, the anisotropic etching RIE further continues. The upper surfaces of the gate electrode 16 and fin-type semiconductor region 13 are exposed. The anisotropic etching RIE continues until the side walls of the fin-type semiconductor region 13 are completely exposed.

FIGS. 5PX and 5PY show the state that the silicon oxide layers 21 on the side walls of the fin-type semiconductor region 13 are completely etched. This state is called over-etching of 100% or more relative to the fin-type semiconductor region. The silicon oxide layer 21 is left on the partial side walls of the gate electrode 16, and the side walls of the gate electrode 16 near the fin-type semiconductor region 13 are covered with the silicon oxide film 21 to the position higher than the fin-type semiconductor region 13. Namely, the silicon oxide layer 21 having a constant width is left between the exposed fin-type semiconductor region 13 and the exposed upper gate electrode 16 to electrically separate both the semiconductor region and gate electrode.

As shown in FIGS. 5QX and 5QY, ion implantation is performed obliquely into the fin-type silicon region 13 to form extension regions and high concentration regions 18 of source/drain regions. If necessary, ion implantation is performed to form pocket regions of an opposite conductivity type. The ion implantation processes may be executed by well-known methods. For example, ion implantation may be executed for the extension and pocket regions before the side wall insulating films 21 are formed, and ion implantation is executed for the high concentration regions after the side wall insulating films 21 are formed or after RIE is completed.

In the case of an n-channel MOS transistor, an n-type source/drain region 18 is formed on the upper surface and side walls of the p-type fin-type silicon region 13. After the ion implantation, annealing is performed at a temperature of 800° C. to 1200° C. to activate implanted impurity ions.

With the processes described above, a fundamental FET structure is formed having the polysilicon gate electrode 16 traversing the fin-type silicon region 13 and the source/drain regions formed on both sides of the polysilicon gate electrode 16.

As shown in FIGS. 5RX and 5RY, a metal layer capable of being silicidated such as Co and Ni is deposited on the whole substrate surface by sputtering to a thickness of, e.g., 2 nm to 30 nm, and a primary silicidation reaction is performed by annealing at 200° C. to 600° C. With this primary silicidation reaction, the metal layer deposited on the silicon layer changes to a silicide layer 24. The unreacted metal layer is removed by an acid solution process or the like, and a secondary silicidation reaction is performed by annealing at 300° C. to 900° C. to form a low resistance silicide layer 24.

The silicide layer 24 is formed on the upper surface and side walls of the fin-type semiconductor region 13 in an area protruding from the gate electrode 16. Although a width of the fin-type semiconductor region is narrow, its height is high. The silicide layer is formed from the upper edge to lower edge of the side walls having a much broader area than that of the upper surface. The silicide layer 24 is formed on the upper surface and upper side walls of the gate electrode 16. The effective resistance of the source/drain regions can be lowered and low resistance contacts of the source/drain electrodes to the source/drain regions are possible. The resistance of the gate electrode and the contact resistance of the lead electrodes are also lowered. The silicide layer on the gate electrode is electrically separated from the silicide layer on the fin-type semiconductor region, by the silicon oxide layers 21 left as the side wall spacers.

As shown in FIGS. 5SX and 5SY, an interlayer insulating film 22 such as a silicon oxide film, a PSG film and a BPSG film is deposited covering the fin-type FET structure. The interlayer insulating film 22 has a thickness of e.g., 400 nm to 1000 nm. After the interlayer insulating film 22 is deposited by CVD or sputtering, its surface is planarized by chemical mechanical polishing (CMP). Contact holes for the source/drain regions and gate electrode are formed through the interlayer insulating film 22 by RIE. Etching the contact holes is performed, for example, by RIE using fluorine containing reactive gas, e.g., $CF_4$, $CHF_3$, $C_2F_6$ and $C_4F_8$ under the conditions of a pressure of 1 Pa to 100 Pa and RF power at 13.56 MHz. Etching of silicon oxide stops at the silicon nitride layer 14.

A barrier layer of Ti, TiN or the like is deposited by sputtering or CVD, a W layer is deposited by CVD, and an unnecessary portion on the interlayer insulating film is removed by CVD. In this manner, conductive plugs 26 of W are buried in the interlayer insulating film 22. The conductive plugs constitute lead electrodes of the source/drain regions and gage electrode. Since the silicide layer is formed on the side walls of the source/drain regions over the whole height near to the channel region, the contact resistance of the lead electrode relative to the channel region can be lowered greatly. Thereafter, a multilayer wiring structure is formed by a well-known method disclosed, for example, in U.S. Pat. Nos. 6,707,156 and 6,693,046, which are incorporated herein by reference.

FIG. 5T is a perspective view of the fin-type FET structure. The gate electrode has an increased width at its one end, and a contact hole is formed at this position to bury the W plug 26. The fin-type silicon region Fin extends in the horizontal direction in FIG. 5T, the portion protruding from the gate electrode G is formed with the silicide layer from the upper to lower edges of the side walls and on the upper surface coupling the side walls, and the W plugs 26 contact the side walls and upper surfaces. If the width of the fin-type region is narrower than the height thereof and a contact is formed only on the upper surface, it is difficult to lower sufficiently the contact resistance. In this embodiment, the silicide layer is formed on the side walls of the fin-type silicon region and on the upper surface thereof if the cap layer is not used. Since the source/drain electrodes are connected to the silicide layers on the broad side walls, it is possible to lower the source/drain contact resistance and the series resistance between the source/drain regions.

Figure 6A:
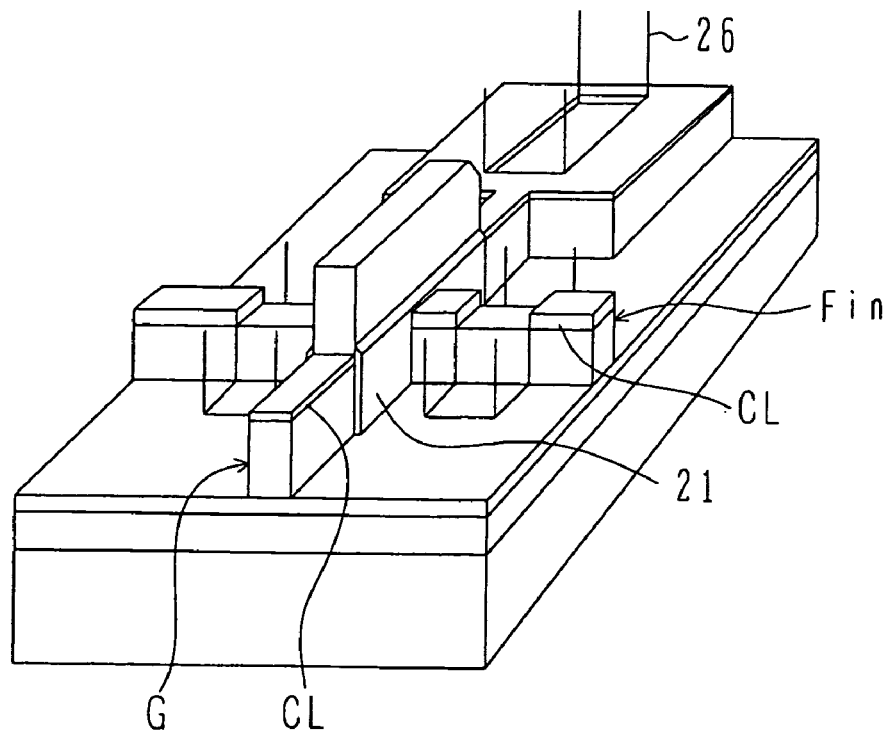
FIGS. 6A and 6B are perspective views showing modifications of the other embodiment.
Figure 6B:
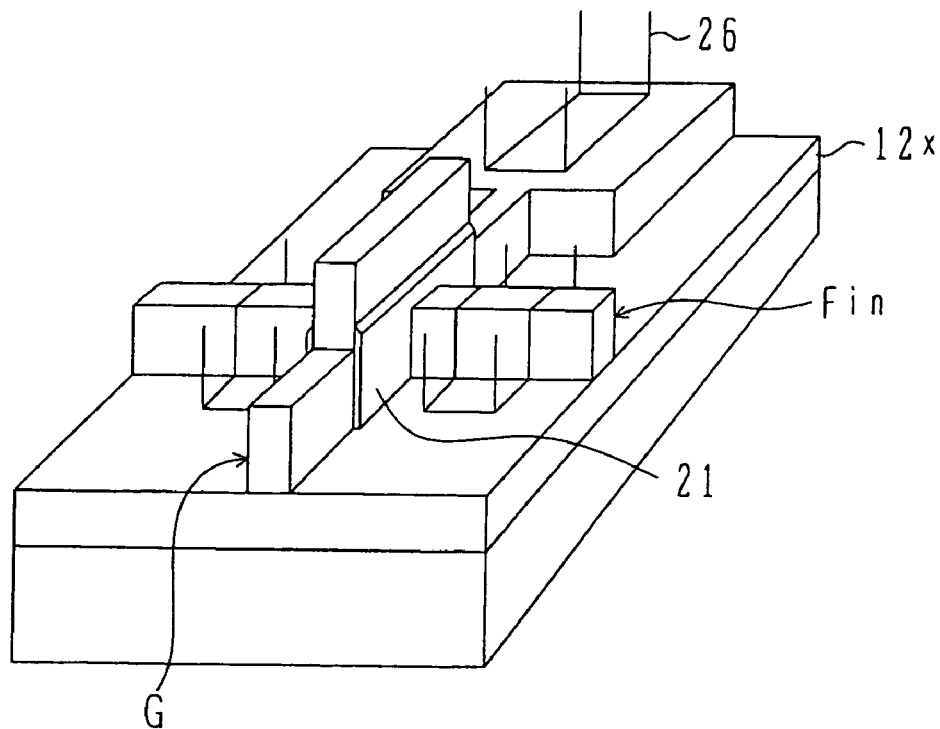
Figure 7:
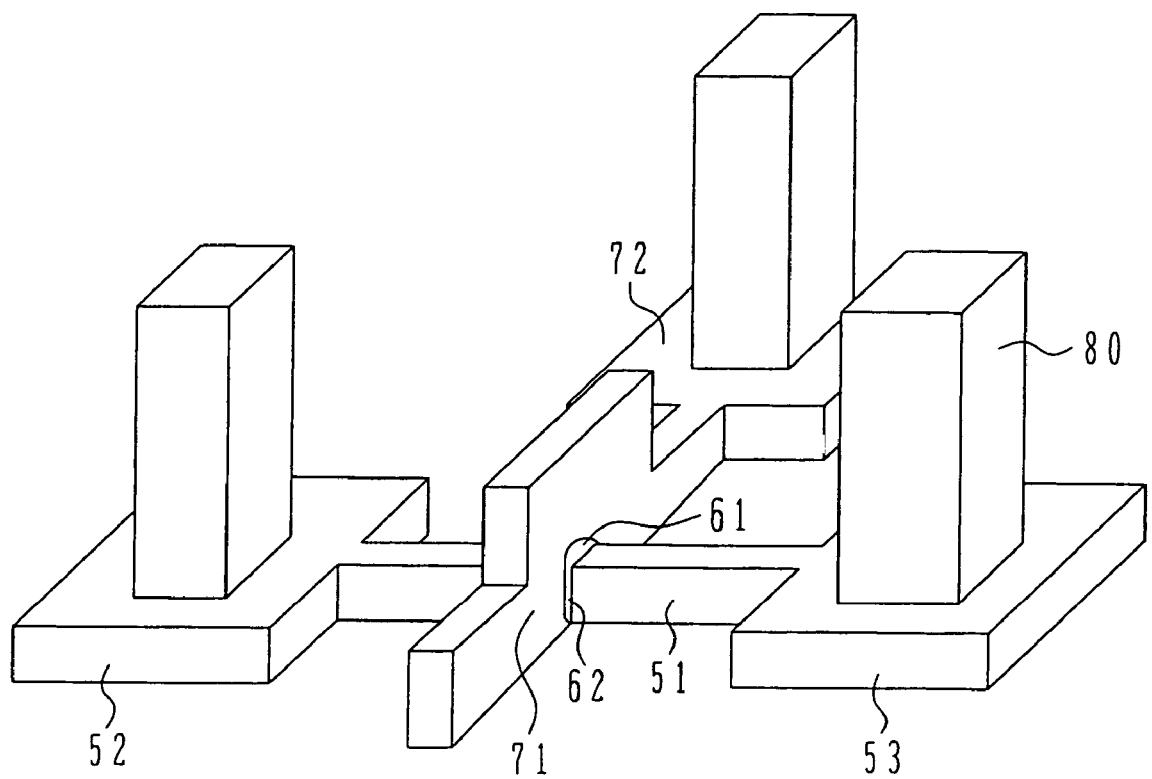
FIG. 7 is a perspective view showing an Fin-FET according to prior art.

FIG. 6A shows a cap layer CL of silicon nitride or silicon oxynitride formed on a fin-type semiconductor region Fin and on a gate electrode G. The cap layer may be used as a hard mask layer when the fin-type semiconductor region Fin and gate electrode G are etched. The silicidation process shown in FIGS. 5RX and 5RY is executed for the side walls of the fin-type semiconductor region Fin and gate electrode G, and the upper surface covered with the cap layer is not silicidated. In etching the contact hole, the cap layer CL is also etched. A silicidation process may further be executed after the cap layer is removed.

In this embodiment, the nitridation process is performed via the silicon layer 13 to form the silicon nitride layer at the interface between the silicon layer and buried oxide film. This silicon nitride layer forming process may be omitted if an SOI substrate having a buried insulating layer of silicon nitride or silicon oxynitride is used.

As shown in FIG. 6A, an SOI substrate is used having a buried insulating film not made of a silicon oxide layer but made of a silicon nitride layer of silicon oxynitride layer 12x. In this case, the buried insulating layer 12x itself functions as an etch stopper, and a silicon nitride layer is not necessary to be formed.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device comprising:
    a support substrate having an insulating surface;
    a fin-type semiconductor region of a first conductivity type formed on said support substrate, said fin-type semiconductor region having a pair of side walls generally vertical to a surface of said support substrate and an upper surface coupling said side walls;
    an insulated gate electrode structure formed traversing an intermediate portion of said fin-type semiconductor region and including a gate insulating film and a conductive gate electrode formed on said gate insulating film, said gate electrode having side walls in conformity with the side walls of said fin-type semiconductor region;
    source/drain regions of a second conductivity type opposite to said first conductivity type, formed in said fin-type semiconductor region on both sides of said conductive gate electrode;
    side wall insulating films including a first side wall insulating film formed on the side walls of said conductive gate electrode and a second side wall insulating film formed on the side walls of said fin-type semiconductor region and having an opening on each of said source/drain regions, extending from an upper edge to a lower edge of each of the side walls of said fin-type semiconductor region;
    a silicide layer formed on a surface of each of said source/drain regions exposed in the opening of said second side wall insulating film; and
    source/drain electrodes contacting said silicide layer.

2. The semiconductor device according to claim 1, wherein said source/drain regions are formed in the side walls and upper surface of said fin-type semiconductor region and said silicide layer is formed on the side walls and upper surface of said fin-type semiconductor region.

3. The semiconductor device according to claim 1, further comprising:
    an insulating protective film formed on the upper surface of said fin-type semiconductor region;
    wherein said gate insulating film is formed on the side walls of said fin-type semiconductor region, and said silicide layer is formed on the side walls of said fin-type semiconductor region.

4. The semiconductor device according to claim 1, further comprising:
    an interlayer insulating film burying said fin-type semiconductor region and said insulating gate structure and having contact holes exposing the opening or openings of said second side wall insulating film;
    wherein said silicide layer is formed in said contact holes.

5. The semiconductor device according to claim 4, wherein said source/drain electrodes are formed burying said contact holes.

6. A semiconductor device comprising:
    a support substrate having an insulating surface;
    a fin-type semiconductor region of a first conductivity type formed on said support substrate, said fin-type semiconductor region having a pair of side walls having a first height and being generally vertical to a surface of said support substrate and an upper surface coupling said side walls;
    an insulated gate electrode structure formed traversing an intermediate portion of said fin-type semiconductor region and including a gate insulating film and a conductive gate electrode formed on said gate insulating film, said gate electrode having side walls having a second height higher than said first height;
    source/drain regions of a second conductivity type opposite to said first conductivity type, formed in said fin-type semiconductor region on both sides of said insulated gate electrode structure;

side wall insulating films not formed on the upper surface and the side walls of said fin-type semiconductor region but formed on lower portions of the side walls of said gate electrode near said fin-type semiconductor region, said side wall insulating films surrounding the upper surface and the side walls of said fin-type semiconductor region;

a silicide layer formed at least on each of the side walls, from upper edges to lower edges thereof, of a portion of said fin-type semiconductor region protruding from said side wall insulating films; and source/drain electrodes contacting said silicide layer on the side walls of said fin-type semiconductor region.

7. The semiconductor device according to claim 6, wherein said source/drain regions are formed in surface layers in the upper surface and the side walls of said fin-type semiconductor region, and said silicide layer are formed on the upper surface and the side walls of said fin-type semiconductor region.

8. The semiconductor device according to claim 6, further comprising:

an insulating protective film formed on the upper surface of said fin-type semiconductor region;

wherein said gate insulating film is formed on the side walls of said fin-type semiconductor region and said silicide layer are formed on the side walls of said fin-type semiconductor region.

9. The semiconductor device according to claim 6, further comprising:

an interlayer insulating film burying said fin-type semiconductor region and said insulated gate electrode structure and formed with contact holes exposing said silicide layers on the side walls of said fin-type semiconductor region;

wherein said source/drain electrodes contact said silicide layer on the side walls of said fin-type semiconductor region in said contact holes.

10. The semiconductor device according to claim 6, wherein said insulating surface of said support substrate is a silicon nitride surface or a silicon oxynitride surface.

* * * * *